United States Patent
Feng et al.

(10) Patent No.: US 10,908,331 B2
(45) Date of Patent: Feb. 2, 2021

(54) DISPLAY SUBSTRATE, MANUFACTURING METHOD THEREOF AND DISPLAY PANEL

(71) Applicants: BOE Technology Group Co., Ltd., Beijing (CN); Beijing BOE Display Technology Co., Ltd., Beijing (CN)

(72) Inventors: He Feng, Beijing (CN); Dong Wang, Beijing (CN); Jiyu Wan, Beijing (CN); Tonghua Yang, Beijing (CN)

(73) Assignees: BOE TECHNOLOGY GROUP CO., LTD., Beijing (CN); BEIJING BOE DISPLAY TECHNOLOGY CO., LTD., Beijng (CN)

( * ) Notice: Subject to any disclaimer, the term of this patent is extended or adjusted under 35 U.S.C. 154(b) by 170 days.

(21) Appl. No.: 15/993,882

(22) Filed: May 31, 2018

(65) Prior Publication Data
US 2019/0094428 A1 Mar. 28, 2019

(30) Foreign Application Priority Data

Sep. 25, 2017 (CN) .......................... 2017 1 0876369

(51) Int. Cl.
*G02B 5/20* (2006.01)
*G02F 1/1335* (2006.01)
(Continued)

(52) U.S. Cl.
CPC ....... *G02B 5/201* (2013.01); *G02F 1/133308* (2013.01); *G02F 1/133512* (2013.01);
(Continued)

(58) Field of Classification Search
CPC ... G02B 5/201; G02B 5/003; G02F 1/136204; G02F 1/133308; G02F 1/133514;
(Continued)

(56) References Cited

U.S. PATENT DOCUMENTS

| 6,219,113 B1 * | 4/2001 | Takahara | G02F 1/1334 |
| | | | 345/98 |
| 2007/0273821 A1 * | 11/2007 | Liou | G02F 1/1339 |
| | | | 349/153 |

(Continued)

FOREIGN PATENT DOCUMENTS

| CN | 103926739 A | 7/2014 |
| CN | 105182596 A | 12/2015 |

(Continued)

OTHER PUBLICATIONS

First office action of Chinese application No. 201710876369.2 dated Sep. 26, 2019.

*Primary Examiner* — Jade R Chwasz
(74) *Attorney, Agent, or Firm* — Fay Sharpe LLP

(57) ABSTRACT

A display substrate and a manufacturing method thereof, and a display panel are provided. The display substrate includes a base substrate with a black matrix BM disposed thereon. The base substrate is provided with a display area and a non-display area, and the BM disposed in the non-display area comprises a first BM portion and a second BM portion. The first BM portion and the second BM portion are sequentially arranged in a direction away from the center of the base substrate, and a gap exists between the first BM portion and the second BM portion. When an external electric field exists around the display substrate, the second BM portion can effectively shield the external electric field, thereby effectively preventing the external electric field from affecting the display area of the display panel. Thus, the display effect of the display substrate is improved.

11 Claims, 6 Drawing Sheets

(51) Int. Cl.
*H01L 51/52* (2006.01)
*G02F 1/1333* (2006.01)
*H01L 27/32* (2006.01)
*G02F 1/1362* (2006.01)

(52) U.S. Cl.
CPC .. *G02F 1/133514* (2013.01); *G02F 1/136204* (2013.01); *H01L 27/3272* (2013.01); *H01L 51/5284* (2013.01); *G02F 2202/22* (2013.01); *H01L 51/5246* (2013.01)

(58) Field of Classification Search
CPC ........... G02F 1/133512; G02F 2202/22; G02F 1/133516; H01L 27/3272; H01L 51/5284; H01L 51/5246; H01L 2227/323; H01L 27/3244

See application file for complete search history.

(56) References Cited

U.S. PATENT DOCUMENTS

2016/0364082 A1* 12/2016 Kimura .................... G06F 3/044
2017/0097528 A1*  4/2017 Kim .................. G02F 1/133514
2017/0235186 A1*  8/2017 Dong ................ G02F 1/133512
                                                               349/106
2017/0331072 A1* 11/2017 Jo ....................... H01L 51/5259

FOREIGN PATENT DOCUMENTS

| CN | 205862051 U | 1/2017 | |
|---|---|---|---|
| KR | 20110072310 A | 6/2011 | |
| WO | WO-2016088998 A1 * | 6/2016 | ............. H01L 51/56 |

\* cited by examiner

DISPLAY SUBSTRATE, MANUFACTURING METHOD THEREOF AND DISPLAY PANEL

CROSS-REFERENCE TO RELATED APPLICATION

This application claims priority to Chinese Patent Application No. 201710876369.2, filed with the State Intellectual Property Office on Sep. 25, 2017, the entire contents of which are incorporated herein by reference.

TECHNICAL FIELD

The present disclosure relates to a display substrate, a manufacturing method thereof and a display panel.

BACKGROUND

With the development of the display technology and rapid increase of the screen-to-body ratio of a display panel, the narrow bezel technology is widely used in a manufacturing process of the display panel.

When the narrow bezel technology is adopted to machine the display panel, a relatively bigger panel is usually manufactured first and then cut into a plurality of display panels. Each of the plurality of display panels may comprise a display substrate with a black matrix (BM) formed thereon. The BM is a conductor with a relatively small resistivity. It should be noted that the relatively bigger panel needs to be cut close to the BM, such that the BM in each display panel obtained through cutting is located at an edge of the corresponding display substrate and is exposed on a side surface of the corresponding display panel.

SUMMARY

The present disclosure provides a display substrate, a manufacturing method thereof and a display panel.

In a first aspect, there is provided a display substrate, including a base substrate with a black matrix BM disposed thereon; the base substrate is provided with a display area and a non-display area, and the BM disposed in the non-display area comprises a first BM portion and a second BM portion, wherein the first BM portion and the second BM portion are sequentially arranged in a direction away from the center of the base substrate, and a gap exists between the first BM portion and the second BM portion.

Optionally, the first BM portion, as well as the second BM portion, takes the shape of a ring, and the second BM portion surrounds the first BM portion.

Optionally, the gap is filled with a target material of which the resistivity is greater than that of the BM.

Optionally, a plurality of color resistance blocks are further disposed in the display area of the base substrate, any position in the gap is a first position, a first color resistance block in the plurality of the color resistance blocks is close to the first position, and the target material filled in the first position is the same as a material of the first color resistance block.

Optionally, the target material is an insulating gas or an insulating solid.

Optionally, the width of the gap is 10 μm to 20 μm.

Optionally, the first BM portion surrounds the display area.

Optionally, a covering layer is disposed on the side, away from the base substrate, of the first BM portion, and the covering layer is made of the same material as the first color resistance block and is connected with the first color resistance block and the target material in the first position respectively.

Optionally, the first color resistance block is made of a colored gel.

Optionally, the insulating gas comprises air, nitrogen, carbon dioxide or sulfur hexafluoride, and the insulating solid comprises nylon, polypropylene, acrylic or polyethylene.

Optionally, a frame sealant is disposed on the side, away from the base substrate, of the second BM portion and permeates the gap.

Optionally, the gap has a vacuum environment inside.

In a second aspect, there is provided a manufacturing method of a display substrate, including: providing a base substrate; and forming a black matrix BM on the base substrate, wherein the base substrate is provided with a display area and a non-display area, the BM disposed in the non-display area includes a first BM portion and a second BM portion which are sequentially arranged in a direction away from the center of the base substrate, and a gap exists between the first BM portion and the second BM portion.

Optionally, forming the black matrix BM on the base substrate includes: forming a BM material layer on the base substrate; processing the BM material layer by means of a primary composition process to obtain a BM pattern, wherein the BM pattern located in the non-display area comprises a first BM portion and a second BM portion; and filling the gap between the first BM portion and the second BM portion with a target material of which the resistivity is greater than that of the BM.

Optionally, after said providing the base substrate, the method further includes: forming a plurality of color resistance blocks in the display area of the base substrate, wherein the first BM portion surrounds the plurality of color resistance blocks; any position in the gap is a first position, a first color resistance block in the plurality of color resistance blocks is close to the first position, and filling the gap between the first BM portion and the second BM portion with the target material includes: filling a material of the first color resistance block into the first position in the gap while forming the first color resistance block on the base substrate.

In a third aspect, there is provided a display panel, including the display substrate in the first aspect.

Optionally, the first BM portion, as well as the second BM portion, takes the shape of a ring, and the second BM portion surrounds the first BM portion.

Optionally, the gap is filled with a target material of which the resistivity is greater than that of the BM.

Optionally, a plurality of color resistance blocks are further disposed in the display area of the base substrate, any position in the gap is a first position, a first color resistance block in the plurality of the color resistance blocks is close to the first position, and the target material filled in the first position is the same as a material of the first color resistance block.

Optionally, the target material is an insulating gas or an insulating solid. The display panel is a liquid crystal display panel or an organic light-emitting diode (OLED) display panel.

DETAILED DESCRIPTION

The present disclosure will be described in further detail with reference to the enclosed drawings, to clearly present the principles and advantages of the present disclosure. Apparently, the embodiments described are only some embodiments of the present disclosure, rather than all embodiments.

Figure 1:
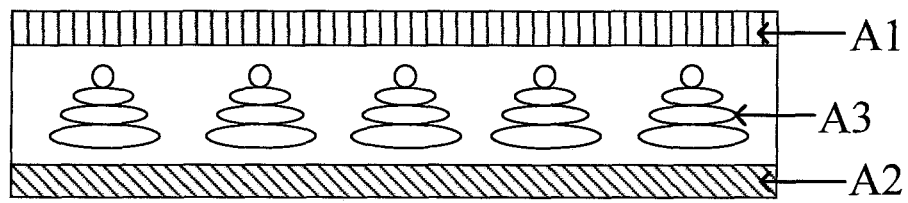
FIG. 1 is a structural schematic diagram of a conventional liquid crystal display panel.

With the development of the display technology, there are more and more types of display panels. For example, the display panels may include liquid crystal display panels and organic light-emitting diode (OLED) display panels. Exemplarily, FIG. 1 is a schematic structural view of a conventional liquid crystal display panel. As shown in FIG. 1, the liquid crystal display panel may comprise an array substrate A1 and a color film substrate A2 that are opposite to each other, as well as a liquid crystal A3 located between the array substrate A1 and the color film substrate A2. Exemplarily, the array substrate A1 may comprise a first base substrate, as well as a plurality of thin film transistors that is disposed on the first base substrate. The color film substrate A2 may comprise a second base substrate, as well as a color film and a black matrix BM that are disposed on the second base substrate.

Figure 2:
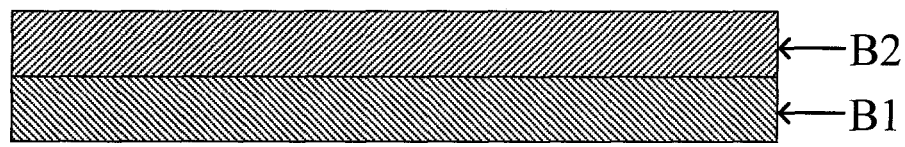
FIG. 2 is a structural schematic diagram of a conventional OLED display panel.

FIG. 2 is a schematic structural view of a conventional OLED display panel. As shown in FIG. 2, the OLED display panel may comprise an OLED substrate B1 and a cover plate B2 that are opposite to each other. The OLED substrate B1 may comprise a third base substrate, as well as a plurality of OLEDs and a BM that are disposed on the third base substrate.

Generally, the main component of the BM is a carbon black particle with a lot of carboxy and hydroxy groups distributed on the surface. The carbon black particle with these groups has a certain polarity, such that the impedance of the BM may not be increased, and the BM may not be completely insulated. The BM may produce an inductive, charge under the impact of an external electric field when the external electric field exists around the display panel, which impacts an internal electric field of the display panel and results in such side effects as ink mura on the display panel.

An embodiment of the present disclosure provides a display substrate which avoids such defects as ink mura etc. The display substrate may be the color film substrate A2 in FIG. 1 or the OLED substrate B1 in FIG. 2, and may also be substrates with BMs in other display panels, which will not be limited by the embodiment of the present disclosure. For example, the other display panels are active-matrix organic light emitting diode (AMOLED) display panels.

Figure 3:
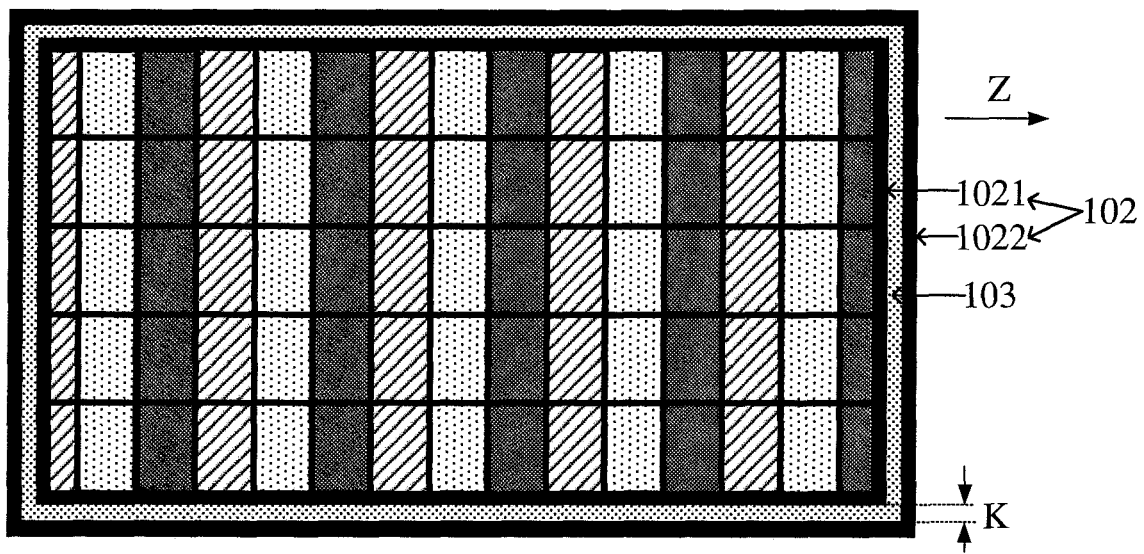
FIG. 3 is a structural schematic diagram of a display panel provided in an embodiment of the present disclosure.

FIG. 3 is a structural schematic diagram of a display panel provided in an embodiment of the present disclosure. As shown in FIG. 3, the display substrate may include: a base substrate (not shown in FIG. 3) with a black matrix BM 102 disposed thereon. The base substrate is provided with a display area and a non-display area, and the BM 102 disposed in the non-display area comprises a first BM portion 1021 and a second BM portion 1022. The first BM portion 1021 and the second BM portion 1022 are sequentially arranged in a direction away from the center of the base substrate (direction Z in FIG. 1), and a gap exists between the first BM portion 1021 and the second BM portion 1022.

To sum up, in the display substrate provided by the embodiment of the present disclosure, the BM in the non-display area comprises the first BM portion and the second BM portion between which the gap exists. When an external electric field exists around the display substrate, the second BM portion may effectively shield the external electric field, thereby effectively preventing the external electric field from affecting the display area of the display panel. Thus, the defects, such as, ink mura etc. of the display substrate are avoided, and the display effect of the display substrate is improved.

Optionally, as shown in FIG. 1, the first BM portion 1021, as well as the second BM portion 1022, may take the shape of a ring, and the second BM portion 1022 surrounds the first BM portion 1021. Exemplarily, the ring may be a square ring or a circular ring. FIG. 1 only takes the first BM portion 1021 and the second BM portion that are square-ring-shaped as an example. Optionally, the first BM portion 1021 may surround the display area of the base substrate.

Optionally, a width K of the gap between the first BM portion 1021 and the second BM portion 1022 may be 10 μm to 20 μm. Exemplarily, the width K of the gap may be 10 μm, 11 μm or 20 μm. It should be noted that the embodiment of the present disclosure only takes the gap with the width K of 10 μm to 20 μm as an example. In practice, the width K of the gap also may be within other ranges, for example, 10 μm to 30 μm, which will not be limited by the embodiment of the present disclosure.

Exemplarily, the gap between the first BM portion 1021 and the second BM portion 1022 may be filled with a target material 103 of which the resistivity is greater than that of the BM. Exemplarily, the target material may be an insulating gas or an insulating solid. The insulating gas may be air, nitrogen, carbon dioxide, sulfur hexafluoride or the like, and the insulating solid may be nylon, polypropylene, acrylic, polyethylene or the like, which will not be limited by the embodiment of the present disclosure. In some embodiments, the gap between the first BM portion 1021 and the second BM portion 1022 may be filled with a material of which the resistivity is greater than that of the BM. Alternatively, the gap is vacuumized. That is, the gap has a vacuum environment inside.

Figure 4:
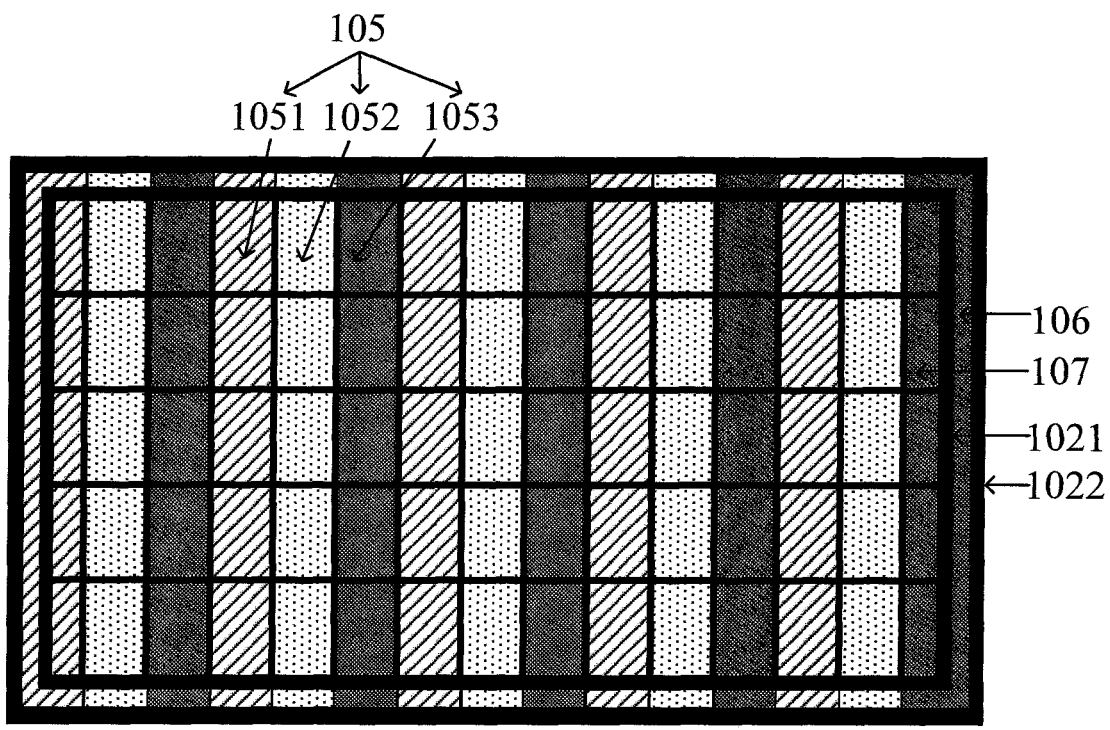
FIG. 4 is a structural schematic diagram of another display panel provided in an embodiment of the present disclosure.

FIG. 4 is a schematic structural view of another display substrate provided by an embodiment of the present disclosure. As shown in FIG. 4, the display substrate may be a color film substrate in a liquid crystal display panel. A plurality of color resistance blocks 105 are disposed in a display area of a base substrate. For example, the color resistance blocks 105 may be made of a colored gel.

Exemplarily, table 1 is a thickness and volume resistivity correlation table of different materials. The unit of thickness is µm. The unit of volume resistivity is Ohm·CM. $1.00E+11$ represents the product of 1.00 and the $11^{th}$ power of 10. $1.00E+13$ represents the product of 1.00 and the $13^{th}$ power of 13. $1.00E+06$ represents the product of 1.00 and the $6^{th}$ power of 6. $2.00E+15$ represents the product of 2.00 and the $15^{th}$ power of 15. As shown in table 1, the thickness of the colored gel is greater than those of various BMs (such as a medium-resistivity BM, a high-resistivity BM and a low-resistivity BM). The volume resistivity of the colored gel is much greater than that of the various BMs.

TABLE 1

| Material | Thickness (µm) | Volume resistivity (Ohm · CM) |
| --- | --- | --- |
| Medium-resisivity BM | 1.2 | 1.00E+11 |
| High-resistivity BM | 1.2 | 1.00E+13 |
| Low-resistivity BM | 1.4 | 1.00E+06 |
| Colored gel | 2.2 | 2.00E+15 |

As the resistivity of the colored gel is much greater than that of the BM, the gap between the first BM portion 1021 and the second BM portion 1022 may be filled with the colored gel that serves as the target material. That is, the target material may comprise a material of at least one color resistance block. Exemplarily, any position in the gap is a first position 106. A color resistance block 107 (a first color resistance block) in the plurality of color resistance blocks is close to the first position 106. The target material filled in the first position 106 may be the same as a material of the color resistance block 107.

For example, the plurality of color resistance blocks may comprise a red color resistance block that allows red light to pass, a green color resistance block that allows green light to pass, and a blue color resistance block that allows blue light to pass. If the color resistance block close to the first position is the red color resistance block, the target material filled in the first position may be the same as the material of the red color resistance block. Generally, the plurality of color resistance blocks are arranged in an array. Each line of the color resistance blocks comprise color resistance blocks with the same color. Any two adjacent lines of the color resistance blocks are different in color. The gap between the first BM portion and the second BM portion may be box-shaped, and may comprise a first portion that is parallel to the line direction of the plurality of color resistance blocks, and a second portion that is perpendicular to the line direction. A material filled in the first portion may comprise the materials of the color resistance blocks with the same color. A material filled in the second portion may comprise the materials of the color resistance blocks with the three colors.

Figure 13:
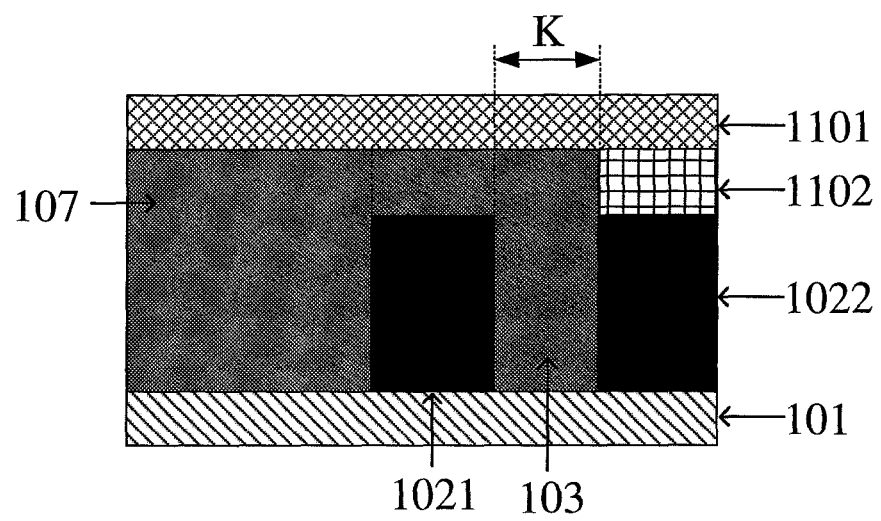
FIG. 13 is a cross sectional view of an edge of a display panel provided in an embodiment of the present disclosure.

Furthermore, referring to FIG. 13, a covering layer (not shown in FIG. 13) may be disposed on the side, away from the base substrate, of the first BM portion 1021, may be made of the same material as the first color resistance block, and is connected with the first color resistance block and the target material in the first position respectively.

In addition, a frame sealant 1102 may be further disposed on the side, away from the base substrate 101, of the second BM portion 1022. In some embodiments, the frame sealant 1102 may permeate the gap between the first BM portion 1021 and the second BM portion (the state in which the frame sealant 1102 permeates the gap is not shown in FIG. 13). At this time, areas of contact between the frame sealant 1022 and other structures in the display substrate are relatively bigger, such that the frame sealant has a relatively better bonding effect.

To sum up, in the display substrate provided by the embodiment of the present disclosure, the BM in the non-display area comprises the first BM portion and the second BM portion between which the gap exists. The first BM portion and the second BM portion are insulated from each other. An external electric field may be effectively prevented from impacting the display area of the display panel when existing around the display substrate because the second BM portion may effectively shield the external electric field. Thus, such side effects as ink mura of the display substrate are avoided. The display effect of the display substrate is improved.

Figure 5:
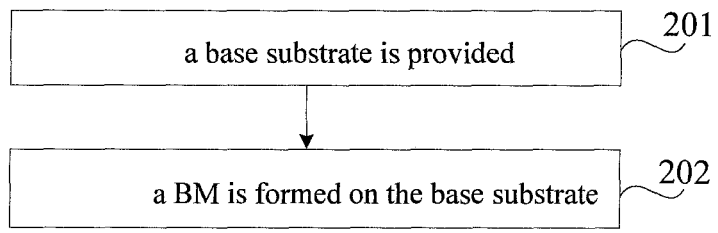
FIG. 5 is a flow chart of a manufacturing method of a display panel provided in an embodiment of the present disclosure.

FIG. 5 is a flow chart of a manufacturing method of a display substrate, provided by am embodiment of the present disclosure. The manufacturing method of the display substrate may be used for manufacturing the display substrate as shown in FIG. 3 or FIG. 4, and may comprise the following steps as shown in FIG. 5.

In step 201, a base substrate is provided.

Figure 6:
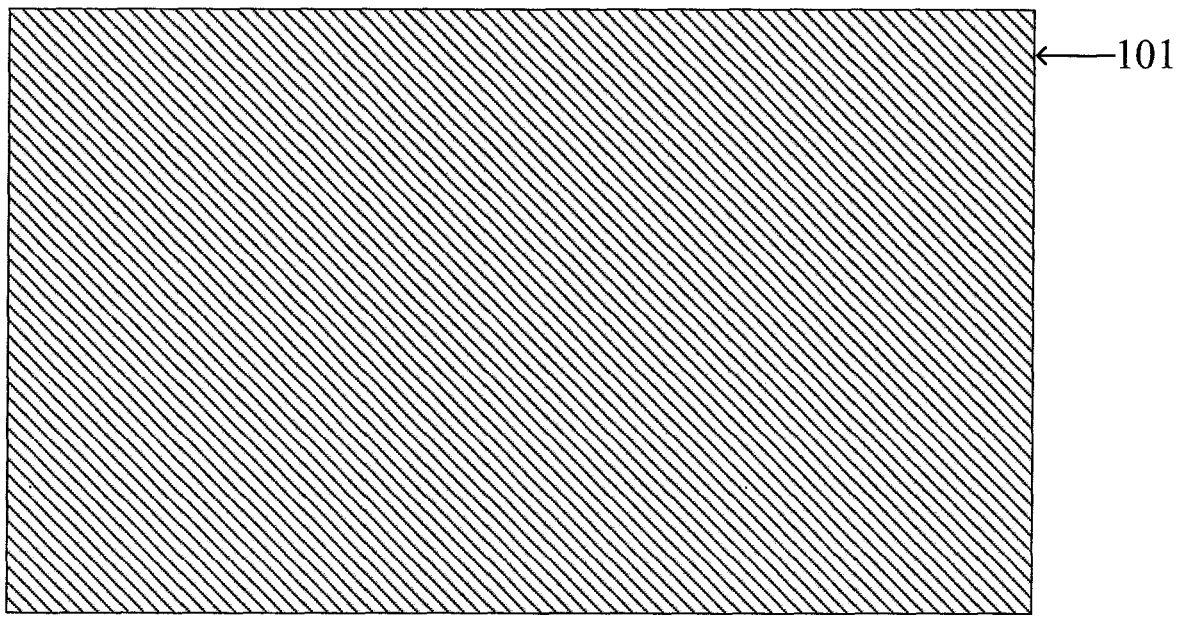
FIG. 6 is a schematic diagram of a partial structure of a display panel provided in an embodiment of the present disclosure.

As shown in FIG. 6, there is provided the base substrate 101. Exemplarily, the base substrate may be a glass substrate or substrates made of other materials, and may take the shape of a rectangle, a circle, an ellipse or others. The embodiment of the present disclosure takes the rectangular substrate as an example.

In step 202, a BM is formed on the base substrate.

Figure 7:
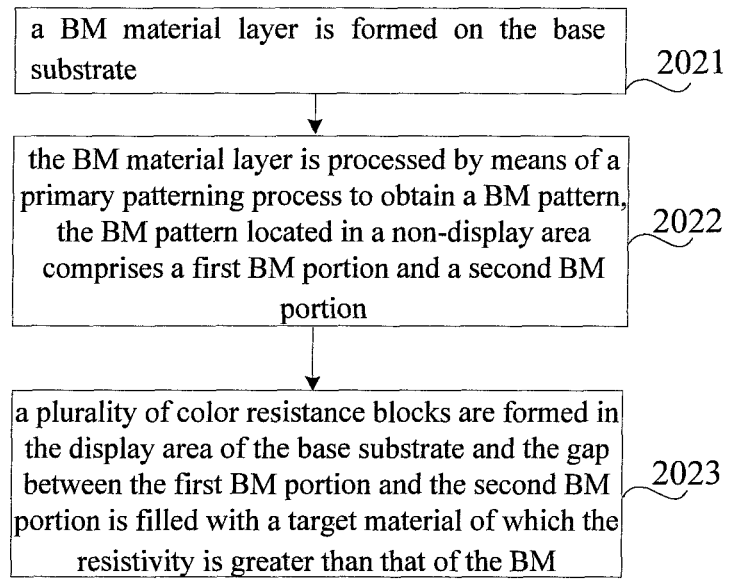
FIG. 7 is a flow chart of a manufacturing method of a black matrix provided in an embodiment of the present disclosure

As shown in FIG. 7, the step 202 may comprise the following sub-steps.

In step 2021, a BM material layer is formed on the base substrate.

Figure 8:
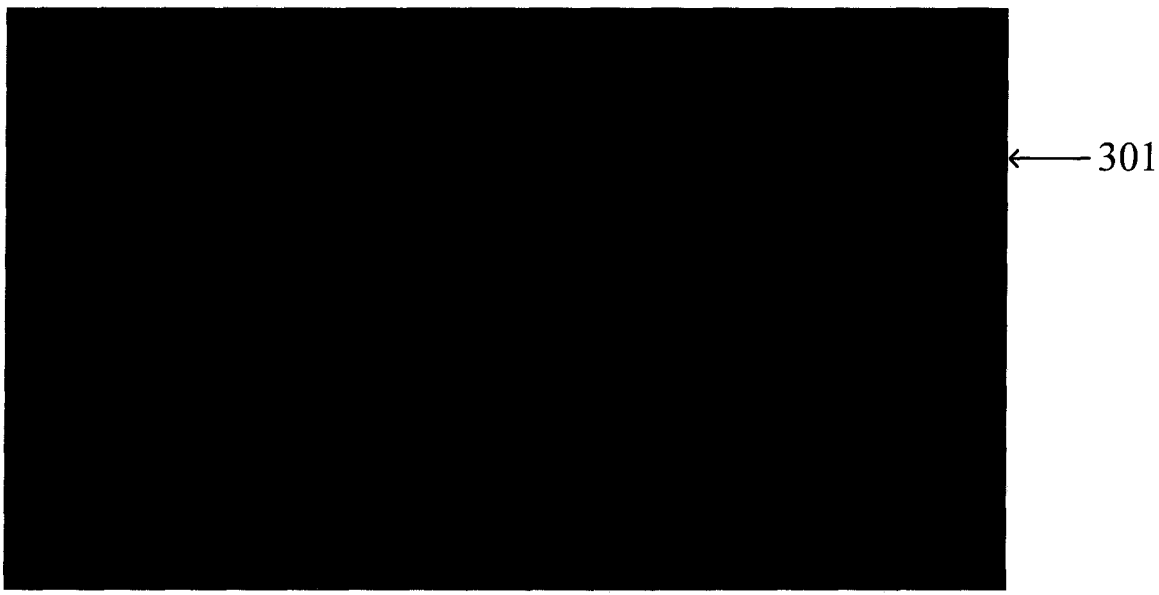
FIG. 8 is a schematic diagram of a partial structure of a display panel provided in an embodiment of the present disclosure.

As shown in FIG. 8, in the step 2021, the BM material layer 301 may be formed on the base substrate 101 as shown in FIG. 6. Exemplarily, a layer of a BM material may be deposited on the base substrate 101 by means of coating, magnetron sputtering, thermal evaporation, plasma enhanced chemical vapor deposition (PECVD) or the like to obtain the BM material layer 301.

In step 2022, the BM material layer is processed by means of a primary patterning process to obtain a BM pattern. The BM pattern located in a non-display area comprises a first BM portion and a second BM portion.

Figure 9:
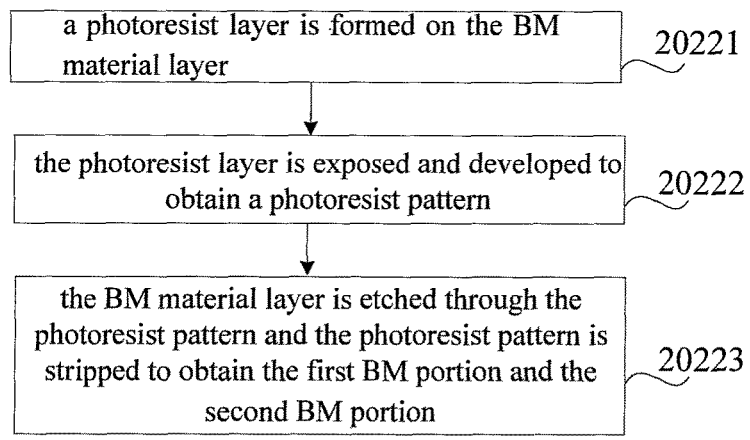
FIG. 9 is a flow chart of a manufacturing method of a BM pattern provided in an embodiment of the present disclosure.

As shown in FIG. 9, the step 2022 may comprise the following sub-steps.

In step 20221, a photoresist layer is formed on the BM material layer.

Figure 10:
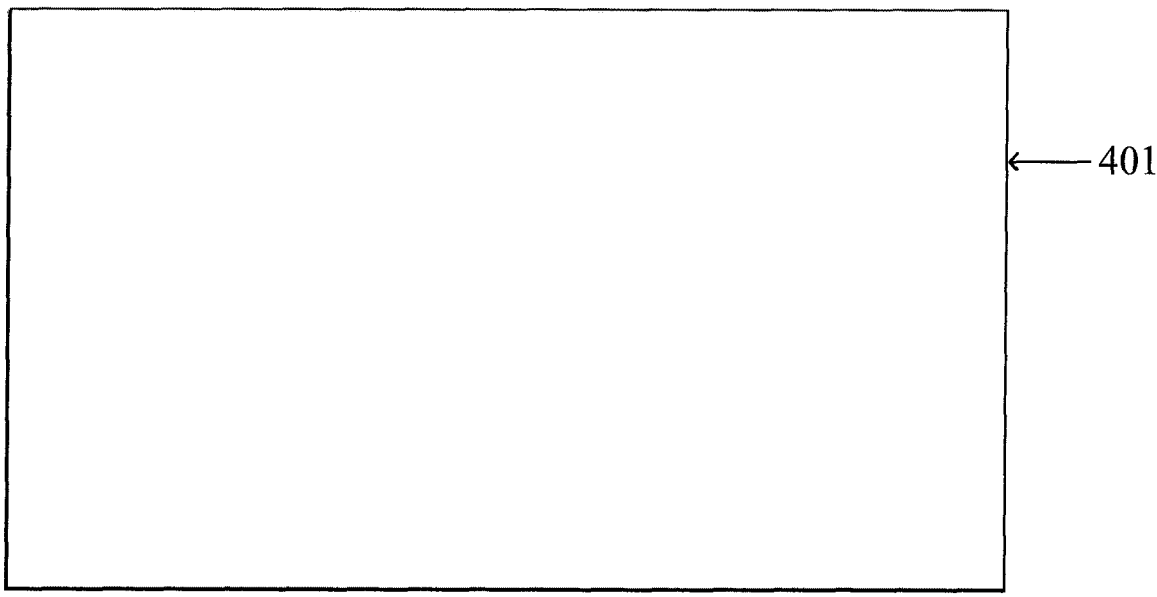
FIG. 10 is a schematic diagram of a partial structure of another display panel provided in an embodiment of the present disclosure.

As shown in FIG. 10, in the step 20221, the photoresist layer 401 may be formed on the BM material layer 301 in FIG. 8 by means of coating, magnetron sputtering, thermal evaporation, PECVD or the like.

In step 20222, the photoresist layer is exposed and developed to obtain a photoresist pattern.

Figure 11:
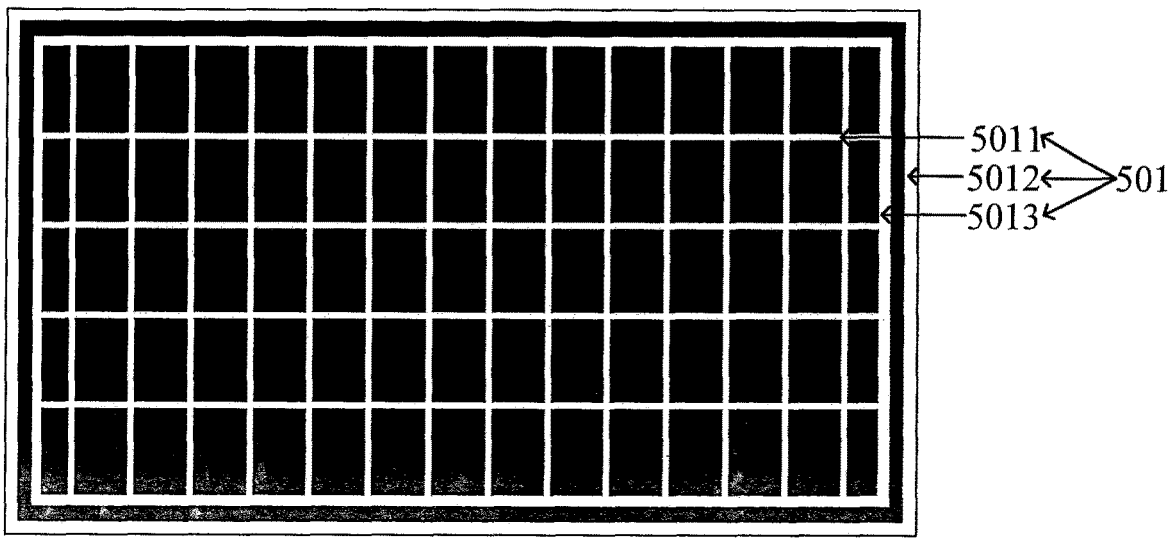
FIG. 11 is a schematic diagram of a partial structure of yet another display panel provided in an embodiment of the present disclosure.

Exemplarily, a photomask may be adopted to expose the photoresist layer 401 in FIG. 10 to form a fully-exposed area and a non-exposed area on the photoresist layer. After that, a development process is adopted for processing to remove a photoresist in the fully-exposed layer and to retain the photoresist in the non-exposed area, thus obtaining the photoresist pattern 501 as shown in FIG. 11.

It should be noted that the base substrate may be provided with a display area (an area with a plurality of black squares in FIG. 11) and the non-display area around the display area. The photoresist pattern 501 in the display area may comprise a photoresist grid 5011. The photoresist pattern 501 in the non-display area 501 may comprise an annular pattern 5012 and an annular pattern 5013 between which a gap exists.

In step 20223, the BM material layer is etched through the photoresist pattern and the photoresist pattern is stripped to obtain the first BM portion and the second BM portion.

Figure 12:
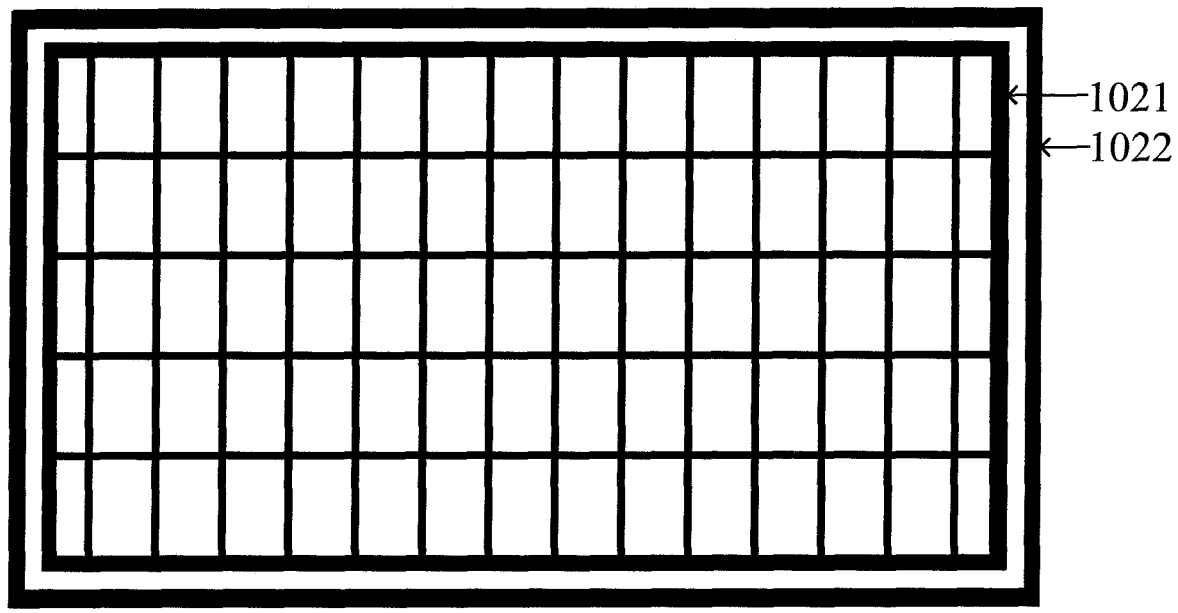
FIG. 12 is a schematic diagram of a partial structure of still yet another display panel provided in an embodiment of the present disclosure.

Since the photoresist pattern formed in the step 20222 covers part of the BM material layer, in the step 20223, the area, not covered with the photoresist pattern, in the BM material layer is etched under the covering action of the photoresist pattern, and the photoresist pattern is stripped to obtain the first BM portion 1021 and the second BM portion 1022 as shown in FIG. 12. The first BM portion 1021 and the second BM portion 1022 may be sequentially arranged in a direction away from the center of the base substrate. A gap exists between the first BM portion 1021 and the second BM portion 1022.

In step 2023, a plurality of color resistance blocks are formed in the display area of the base substrate and the gap between the first BM portion and the second BM portion is filled with a target material of which the resistivity is greater than that of the BM.

It should be noted that the color resistance block and the target material with which the gap is filled may be synchronously formed or formed step by step. When the color resistance block and the target material with which the gap is filled are formed step by step, the color resistance block may be formed before the gap is filled with the target material, or the gap is filled with the target material before the color resistance block is formed, which will not be limited by the embodiment of the present disclosure.

When the color resistance block and the target material with which the gap is filled are synchronously formed, the gap may be filled with the target material while the color resistance block is formed. Exemplarily, referring to FIG. 4, the plurality of color resistance blocks 105 in the display area usually comprise a red color resistance block 1051, a green color resistance block 1052 and a blue color resistance block 1053. During manufacture of the plurality of color resistance blocks, the red color resistance block 1051, the green color resistance block 1052 and the blue color resistance block 1053 may be formed step by step. During formation of each color resistance block, a color resistance material layer is generally formed on the base substrate, then, the photoresist layer is formed on the color resistance material layer, and the photomask is adopted to perform photoetching on the photoresist, such that the color resistance blocks covered with the photoresist may be obtained. After obtaining of the three color resistance blocks, the photoresist that covers the three color resistance blocks may be stripped. It should be noted that photoetching includes three steps, namely exposure, development and etching.

During formation of the color resistance material layer, the color resistance material layer may extend toward the non-display area to cover the first BM portion and the gap between the first BM portion and the second BM portion.

The photoresist that is formed on the color resistance layer may cover the first BM portion and the color resistance material layer on the gap. During etching of the color resistance material layer for forming the color resistance block, the color resistance material layer in each first position, adjacent to the color resistance block, in the gap may be reserved. The color resistance material layer in the position, not adjacent to the color resistance block, in the gap is etched. Thus, the color resistance block and the target material filled in each first position 106 adjacent to the color resistance block are formed. The target material may be the same as the material of the color resistance block.

Herein, as shown in FIG. 4, the color resistance block may include a plurality of color resistance blocks 107. In the gap between the first BM portion and the second BM portion, the material filled in the first position adjacent to each color resistance block 107 may be the same as the material of the color resistance block 107. The color resistance block 107 may be the red color resistance block 1051, the green color resistance block 1052 or the blue color resistance block 1053.

After formation of all the color resistance blocks on the base substrate, the gap may be filled with the target material that includes the materials of various color resistance blocks. Generally, the color resistance blocks are made of colored gels (such as the red color resistance block made of a red colored gel, the green color resistance block made of a green colored gel and the blue color resistance block made of a blue colored gel). Since the colored gels have the resistivity much greater than that of the BM, at this moment, the gap will be filled with the target material of which the resistivity is greater than that of the BM. In this way, the external electric field may be further prevented from impacting the display substrate.

To sum up, in the display substrate manufactured by the manufacturing method of the display substrate, which is provided by the embodiment of the present disclosure, the BM in the non-display area comprises the first BM portion and the second BM portion between which the gap exists. The external electric field may be effectively prevented from impacting the display area of the display panel when existing around the display substrate because the second BM portion may effectively shield the external electric field. Thus, such defects as ink mura etc. of the display substrate are avoided. The display effect of the display substrate is improved.

An embodiment of the present disclosure provides a display panel which comprises a display substrate as shown in FIG. 3 or FIG. 4. The display panel may adopt a similar structure to a liquid crystal display panel (for example, a color film substrate in FIG. 1 is replaced with the display substrate as shown in FIG. 3 or FIG. 4). In addition, the display panel may be an OLED display panel when a color resistance block in FIG. 3 or FIG. 4 is replaced with an OLED.

Exemplarily, FIG. 13 is a sectional view of an edge of a liquid crystal display panel provided by an embodiment of the present disclosure. As shown in FIG. 13, the edge of the liquid crystal display panel may comprise a base substrate 101, an array substrate 1101, a color resistance block 107, a first BM portion 1021, a second BM portion 1022, a frame sealant 1102 and a target material 103 that is filled in a gap K. The second BM portion 1022 and the target material 103 may effectively prevent an external electric field from impacting the liquid crystal display panel.

Figure 14:
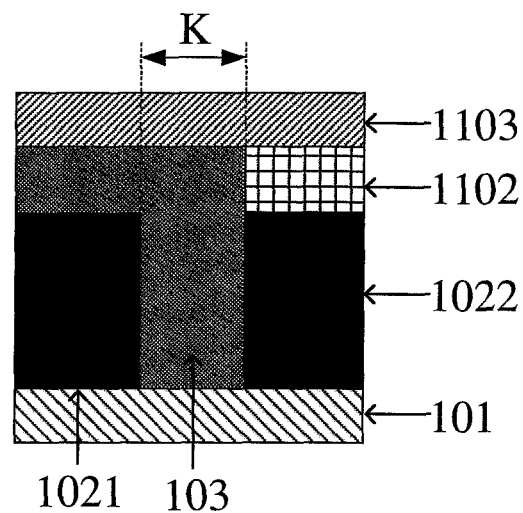
FIG. 14 is a cross sectional view of an edge of an OLED display panel provided in an embodiment of the present disclosure.

FIG. 14 is a sectional view of an edge of an OLED display panel panel provided by an embodiment of the present disclosure. As shown in FIG. 14, the OLED display panel at least comprises a base substrate 101, a cover plate 1103, a first BM portion 1021, a second BM portion 1022, a frame sealant 1102 and a target material that is filled in a gap K. The target material 103 may effectively prevent an external electric field from impacting the liquid crystal display panel.

For example, if the frame sealant permeates the gap between the first BM portion and the second BM portion, areas of contact between the frame sealant and devices in the display panel are relatively bigger. Thus, the bonding effect of the frame sealant is relatively better. The frame sealing effect of the display panel is improved.

To sum up, in the display substrate provided in the embodiment of the present disclosure, the BM in the non-display area comprises the first BM portion and the second BM portion between which the gap exists. When an external electric field exists around the display substrate, the second BM portion may effectively shield the external electric field, thereby effectively preventing the external electric field from affecting the display area of the display panel. Thus, the defects, such as, ink mura etc. of the display substrate are avoided, and the display effect of the display substrate is improved.

An embodiment of the present disclosure further provides a display panel, including any of the above display substrates. The display panel may be: a liquid crystal display panel, an electronic paper, an OLED display panel, a mobile phone, a tablet, a TV, a display, a laptop computer, a digital phone frame, a navigator, or any other products or parts with display functionality It should be noted that the embodiments of the display substrate, the embodiments of the manufacturing method of the display substrate and the embodiments of the display panel in the present disclosure may be made reference to each other, which is not limited in the embodiments of the present disclosure.

Other embodiments of the present disclosure may be available to those skilled in the art upon consideration of the specification and practice of the present disclosure herein. The present disclosure is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

It should be understood that the present disclosure is not limited to the precise constructions described above and shown in the enclosed drawings, and various modifications and changes may be made without departing from the scope thereof. The scope of the present disclosure can be limited only by the appended claims.

What is claimed is:

1. A display substrate, comprising:
   a base substrate with a black matrix disposed thereon;
   the base substrate being provided with a display area and a non-display area, and the black matrix disposed in the non-display area comprising a first black matrix portion and a second black matrix portion, wherein
   the first black matrix portion and the second black matrix portion are sequentially arranged in a direction away from the center of the base substrate and are electrically isolated from each other, and a gap exists between the first black matrix portion and the second black matrix portion;
   a plurality of color resistance blocks are further disposed in the display area of the base substrate, any position in the gap is a first position, a first color resistance block in the plurality of the color resistance blocks is close to the first position, and the target material filled in the first position is the same as a material of the first color resistance block;
   a covering layer is disposed on the side, away from the base substrate, of the first BM portion, and the covering layer is made of the same material as the first color resistance block and is connected with the first color resistance block and the target material in the first position respectively; and
   the first color resistance block is made of a colored gel.

2. The display substrate according to claim 1, wherein the first black matrix portion, as well as the second black matrix portion, takes the shape of a ring, and the second black matrix portion surrounds the first black matrix portion.

3. The display substrate according to claim 2, wherein the first black matrix portion surrounds the display area.

4. The display substrate according to claim 1, wherein the width of the gap is 10 μm to 20 μm.

5. The display substrate according to claim 1, wherein a frame sealant is disposed on the side, away from the base substrate, of the second black matrix portion and permeates the gap.

6. The display substrate according to claim 1, wherein the gap has a vacuum environment inside.

7. A manufacturing method of a display substrate, comprising:
   providing a base substrate; and
   forming a black matrix on the base substrate, wherein
   the base substrate is provided with a display area and a non-display area, the black matrix disposed in the non-display area comprises a first black matrix portion and a second black matrix portion which are sequentially arranged in a direction away from the center of the base substrate and are electrically isolated from each other, and a gap exists between the first black matrix portion;
   a plurality of color resistance blocks are further disposed in the display area of the base substrate, any position in the gap is a first position, a first color resistance block in the plurality of the color resistance blocks is close to the first position, and the target material filled in the first position is the same as a material of the first color resistance block;
   a covering layer is disposed on the side, away from the base substrate, of the first BM portion, and the covering layer is made of the same material as the first color resistance block and is connected with the first color resistance block and the target material in the first position respectively; and
   the first color resistance block is made of a colored gel.

8. The method according to claim 7, wherein said forming the black matrix on the base substrate comprises:
   forming a black matrix material layer on the base substrate;
   processing the black matrix material layer through a primary composition process to obtain a black matrix pattern, wherein the black matrix pattern located in the non-display area comprises a first black matrix portion and a second black matrix portion; and
   making the gap between the first black matrix portion and the second black matrix portion to have a vacuum environment inside.

9. The method according to claim 8, after said providing the base substrate, further comprising:

forming a plurality of color resistance blocks in the display area of the base substrate, wherein the first black matrix portion surrounds the plurality of color resistance blocks.

10. A display panel, comprising a display substrate, wherein the display substrate comprises a base substrate with a black matrix disposed thereon;

the base substrate is provided with a display area and a non-display area, and the black matrix disposed in the non-display area comprises a first black matrix portion and a second black matrix portion; and the first black matrix portion and the second black matrix portion are sequentially arranged in a direction away from the center of the base substrate and are electrically isolated from each other, and a gap exists between the first black matrix portion and the second black matrix portion;

a plurality of color resistance blocks are further disposed in the display area of the base substrate, any position in the gap is a first position, a first color resistance block in the plurality of the color resistance blocks is close to the first position, and the target material filled in the first position is the same as a material of the first color resistance block;

a covering layer is disposed on the side, away from the base substrate, of the first BM portion, and the covering layer is made of the same material as the first color resistance block and is connected with the first color resistance block and the target material in the first position respectively; and the first color resistance block is made of a colored gel.

11. The display panel according to claim 10, wherein the first black matrix portion, as well as the second black matrix portion, takes the shape of a ring, and the second black matrix portion surrounds the first black matrix portion.

* * * * *